US005699232A

United States Patent [19]
Neidig et al.

[11] Patent Number: 5,699,232
[45] Date of Patent: Dec. 16, 1997

[54] POWER SEMICONDUCTOR MODULE HAVING A PLASTIC HOUSING A METAL/CERAMIC MULTILAYER SUBSTRATE AND TERMINALS IN A SOFT ENCAPSULATION

[75] Inventors: Arno Neidig, Schwetzingen; Peter Kinzel, Büttelborn, both of Germany

[73] Assignee: Ixys Semiconductor GmbH, Lampertheim, Germany

[21] Appl. No.: 578,477

[22] Filed: Dec. 26, 1995

[30] Foreign Application Priority Data

Dec. 24, 1994 [DE] Germany ............ 44 46 527.0

[51] Int. Cl.$^6$ ................................ H05K 7/20
[52] U.S. Cl. ............... 361/752; 174/52.2; 257/687; 361/715
[58] Field of Search ................ 174/52.2, 260, 174/16.3, 252; 257/687, 692, 693, 764, 706, 713, 730; 165/80.3, 185; 361/704–713, 715, 736, 717–719, 752, 792, 795, 760, 767

[56] References Cited

U.S. PATENT DOCUMENTS

| | | |
|---|---|---|
| 4,436,951 | 3/1984 | Rief ............ 174/52.2 |
| 4,514,587 | 4/1985 | Soerewyn ............ 174/52 H |
| 4,558,510 | 12/1985 | Tani ............ 29/588 |
| 4,639,759 | 1/1987 | Neidig ............ 357/74 |
| 4,670,771 | 6/1987 | Neidig ............ 357/74 |
| 4,731,644 | 3/1988 | Neidig ............ 357/72 |
| 5,296,739 | 3/1994 | Heilbronner ............ 257/687 |
| 5,563,380 | 10/1996 | Rostoker ............ 174/260 |

FOREIGN PATENT DOCUMENTS

| | | |
|---|---|---|
| 0 118 022 B1 | 9/1984 | European Pat. Off. . |
| 0 292 848 B1 | 11/1988 | European Pat. Off. . |
| 31 27 457 C2 | 2/1983 | Germany . |
| 40 01 554 A1 | 7/1991 | Germany . |

*Primary Examiner*—Gerald P. Tolin
*Attorney, Agent, or Firm*—Herbert L. Lerner; Laurence A. Greenberg

[57] ABSTRACT

A power semiconductor module includes a plastic housing having a bottom plane in which a substrate is disposed. Disposed inside the module are the substrate, structures on the substrate, a rubber-like soft encapsulation and a hard encapsulation above the soft encapsulation. Internal struts of the housing extend into the soft encapsulation and, if appropriate, have ends with transverse extensions disposed within the soft encapsulation. The effect of this module construction is that a back pressure or reaction opposes forces acting externally on the substrate.

9 Claims, 3 Drawing Sheets

POWER SEMICONDUCTOR MODULE HAVING A PLASTIC HOUSING A METAL/CERAMIC MULTILAYER SUBSTRATE AND TERMINALS IN A SOFT ENCAPSULATION

BACKGROUND OF THE INVENTION

Field of the Invention

The invention relates to a power semiconductor module having a plastic housing with a bottom plane, internal struts within the housing, and a substrate, especially a metallic substrate or a metal/ceramic multilayer substrate disposed in the bottom plane, the substrate having components and terminals on the inside of the module, and the module having a soft encapsulation and a hard encapsulation.

Such modules are suitable for producing bridges or parts of bridges in a power converter circuit.

Modules with such a structure, i.e. having a plastic housing and a copper/ceramic substrate as a base, have some desirable properties such as, for example, comparatively low weight and good thermal conduction properties for dissipating heat from heat-generating components within the module, through the thin base substrate, to a heat sink. However, the base substrate is fragile and can possibly deform, as a result of which the heat dissipation can be impaired. In order to deal with such problems, many proposals for module construction are already known which may be partly applicable in the context of the module structure proposed according to the invention.

A module as described above is disclosed in German Patent DE 31 27 457 C2. In the case of that module, a substrate constructed as a copper/ceramic/copper sandwich is fitted as the base plane into a plastic housing. By virtue of such a multilayer substrate structure, the risk of fracture is already considerably reduced as compared to a ceramic base. The frame-shaped plastic housing has internal struts. The multilayer substrate is produced by using a direct bonding process to yield a ceramic/copper composite and is equipped with semiconductor elements. The piece of the substrate facing the interior of the module is first provided with a silicone resin layer injected as a soft encapsulation. An epoxy resin is injected thereon as a hard encapsulation to form a casing. The height of the soft encapsulation is considerably below the lower edge of the internal struts, so that the hard encapsulation can be distributed uniformly in chambers formed by the struts.

In the case of a module according to Published European Application 0 118 022 B1, provision is made, as a further measure for reducing the risk of fracture when mounting the module on a heat sink, for fastening flanges being integrally molded onto the plastic housing to be provided with slits between the walls of the housing frame and fastening holes of lugs. That effectively prevents the mechanical stress field in the region of the fastening screws from being transmitted to the substrate.

Many measures are already known for counteracting concave deflection of the substrate, which would impair the heat transmission. Published European Application 0 205 746 B1 discloses the disposition of supports on the substrate or on components, as such a measure. The interior of the module in that case is filled partly with a soft casting compound and partly with a hard casting compound poured thereover. The supports extend into the hard casting compound, so that a rigid connection is provided between the plastic housing, which is domed at that location, and selected substrate surfaces, to enable forces to thereby be transmitted.

German Published, Non-Prosecuted Application DE 40 01 554 A1 discloses a construction of a plastic housing with integrally molded supports, in which the integrally molded supports press directly onto the substrate at a plurality of points.

Published European Application 0 292 848 B1 discloses a module in which the plastic housing has internal struts that do not, however, serve as supports for the substrate but are disposed for the purpose of guiding terminal lugs. As already mentioned, power semiconductor modules are generally mounted on heat sinks in order to dissipate power losses. So-called thermal transfer pastes are preferably used to improve the thermal transfer between the base of the module and the surface of the heat sink. Those are mixtures of metal oxides and silicone oils or esters and may be very viscous. Especially if the paste is applied too thickly and non-uniformly onto the base of the module or onto the heat sink, there is the possibility that the paste will not immediately be distributed thinly when the module is pressed onto the heat sink, particularly when pressing is carried out very quickly, for example with the aid of electrical or pneumatic screwdrivers. In such a case, the substrate must bend inwards at least temporarily, and it may break under excessive mechanical loading. The inward flexibility of the substrate is predominantly conditioned by the type of casting technique. In the conventional casting technique, the hard encapsulation is introduced after introduction and crosslinking of the soft encapsulation, and is cured at relatively high temperatures of more than 100° C. The soft encapsulation expands greatly during the curing process. The volume expansion of silicone resins is typically approximately 10% if the temperature rise is 100K. After curing of the hard encapsulation and cooling, the soft encapsulation shrinks to its original volume, leaving a considerable gap between the soft and hard encapsulations. However, the flexibility of the substrate is not conditioned only by that gap, but also by the use of soft silicone gels. The result thereof is that the soft encapsulation lying directly above the substrate cannot provide a sufficient antagonistic or counter force (reaction or back pressure) to a force acting externally on the substrate.

Supports of the above-described known type can contribute little to solving this problem, since they can produce an antagonistic or counter force only on tightly limited substrate areas. If the thermal transfer paste is distributed non-uniformly, unacceptable mechanical stresses can occur locally in the substrate. Supports that are integrated in the housing by virtue of a corresponding housing construction furthermore have the disadvantage of requiring that the housing be matched to the substrate layout and to the fitting of components, as a result of which such a housing cannot be used universally.

SUMMARY OF THE INVENTION

It is accordingly an object of the invention to provide a power semiconductor module, which overcomes the hereinafore-mentioned disadvantages of the heretofore-known devices of this general type and which is better protected than known modules against a risk of fracture occurring when mounting the module.

With the foregoing and other objects in view there is provided, in accordance with the invention, a power semiconductor module, comprising a plastic housing having a bottom plane; a substrate, especially a metallic substrate or a metal/ceramic multilayer substrate, disposed in the bottom plane of the housing; structures including components and terminals and being disposed on the substrate in the housing;

a hard encapsulation disposed in the housing; a soft encapsulation being disposed in the housing and being formed of a soft casting compound having a rubber-like consistency with a Shore hardness of ≧20 (Shore A Hardness) after vulcanization; and internal struts in the housing being at least partly disposed in the soft encapsulation and having no direct contact with the substrate nor with the structures.

In accordance with another feature of the invention, the substrate defines a plane, and the struts extend perpendicularly relative to the plane of the substrate and have an end facing the substrate with an L-shaped or T-shaped transverse extension on the end.

In accordance with a further feature of the invention, the substrate defines a plane, and the struts extend horizontally relative to the plane of the substrate and are disposed completely within the soft encapsulation.

In accordance with an added feature of the invention, the struts guide the terminals.

In accordance with an additional feature of the invention, the housing has integrally molded fastening flanges, integrally molded housing walls, and wall regions between the fastening flanges and the housing walls having slits formed therein.

In accordance with yet another feature of the invention, there is provided a metal baseplate being connected to a lower surface of the metal-ceramic multilayer substrate.

In accordance with a concomitant feature of the invention, only the soft encapsulation and no hard encapsulation is present.

The soft encapsulation, which is rubber-like in the cured state and has housing struts penetrating into it, on one hand advantageously causes a high resistance to warping of the substrate towards the interior of the module and, on the other hand, avoids differential local deflection of the substrate. The proposed measure is furthermore cost-effective to produce, while avoiding additional components which would need to be adjusted during the module manufacture.

Other features which are considered as characteristic for the invention are set forth in the appended claims.

Although the invention is illustrated and described herein as embodied in a power semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
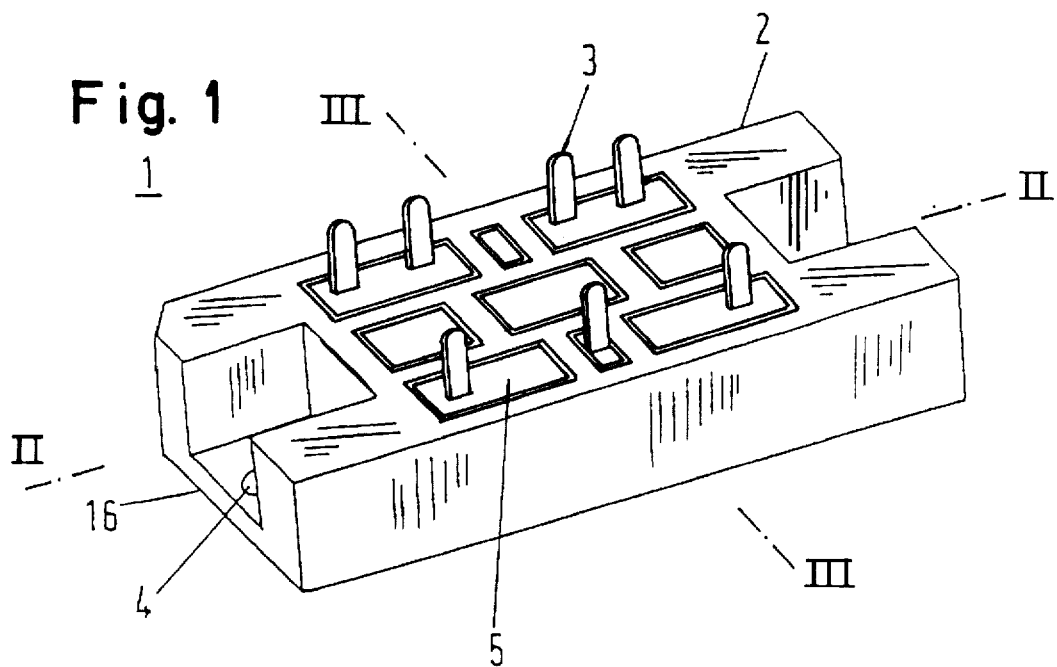
FIG. 1 is an overall diagrammatic, perspective view of a finished power semiconductor module.

Referring now to the figures of the drawing in detail and first, particularly, to FIG. 1 thereof, there is seen an external view of a power semiconductor module 1. The power semiconductor module 1 has a plastic housing 2 with openings 5 at the top for injecting casting compounds, and fastening flanges 16 with round or slit-shaped fastening openings 4. Electrical terminals 3 project from the module at the top. Section planes II—II and III—III are furthermore indicated in FIG. 1.

Figure 2:
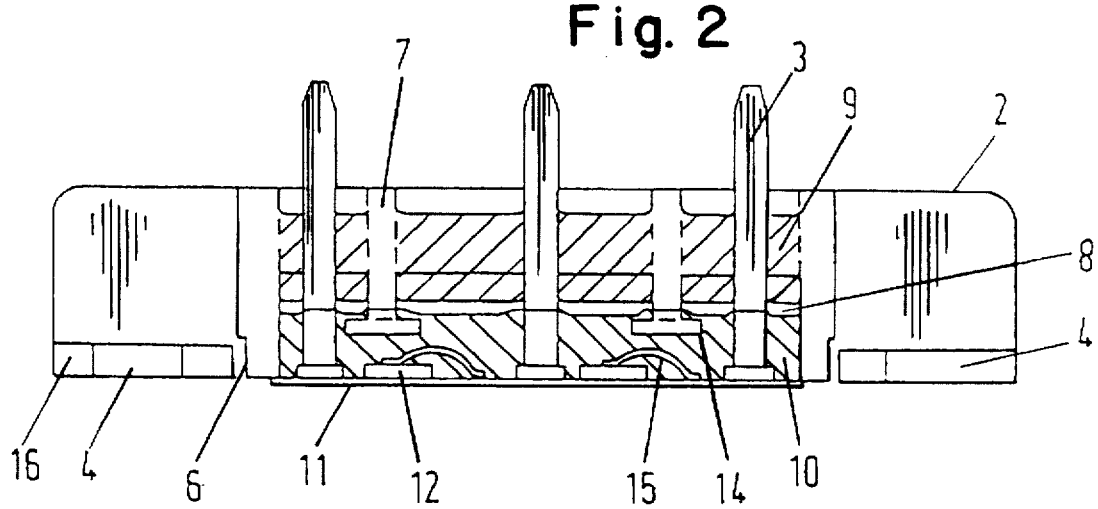
FIGS. 2 and 3 are respective longitudinal-sectional views of the module taken along lines II—II and III—III thereof.

Further details of the module structure can be gathered from the section represented in FIG. 2, which is taken along the plane II—II. A substrate 11 is fitted into the housing 2 at a base plane. The substrate 11 is preferably a multilayer substrate, which is produced through using a direct bonding process by superposition of a copper foil, a ceramic plate and another copper foil. It is, however, additionally possible to also solder a copper plate which, for example, is 3 mm thick, on the substrate 11 at the bottom to provide strengthening.

The substrate 11 supports structures such as semiconductor components 12, bonding wires 15 and the terminals 3, on a side thereof facing into the module. The components 12 are covered by a soft encapsulation 10 and a hard encapsulation 9 is located thereover. A gap 8 between the casting compounds 9, 10 is produced by shrinking processes during production.

The housing 2 has struts 7. At least a part of the struts 7 are configured in such a way that a lower end thereof projects into the soft encapsulation 10. The struts 7 penetrating into the soft encapsulation are preferably located in the central region of the module 1, where the substrate 11 would flex to the greatest extent if it were not supported. Another essential fact is that a more uniform internal reaction or back pressure is achieved thereby. The struts 7 have no contact with the substrate or structures on the substrate.

Figure 3:
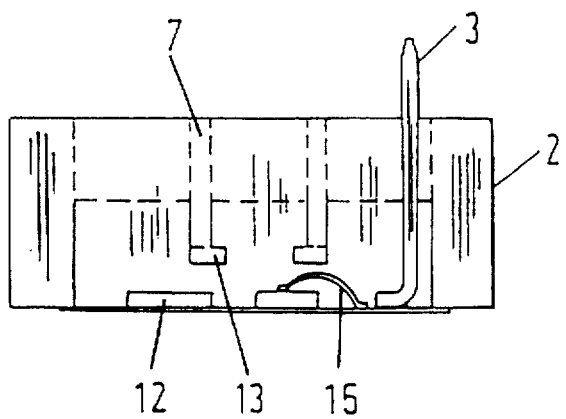

Insofar as it is not possible to achieve a sufficient antagonistic or counter force through the number of struts 7 or their wall thickness, L-shaped transverse extensions 13 shown in FIG. 3 or T-shaped transverse extensions 14 of the struts 7 may be provided on the part penetrating into the soft encapsulation, depending on the hardness of the soft casting compound.

Figure 8:
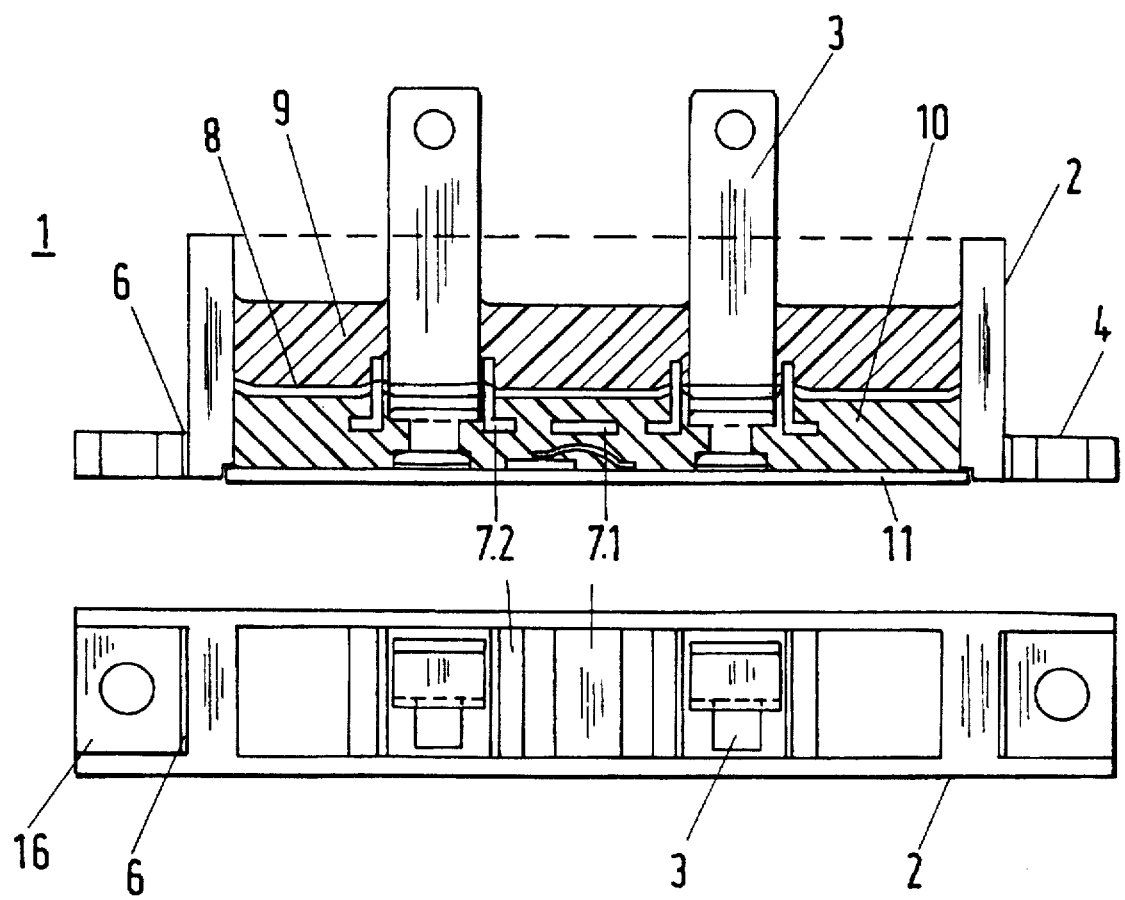
FIG. 8 includes a longitudinal-sectional view and a plan view of a power semiconductor module with a variant strut embodiment.

It can furthermore be seen from FIGS. 2 and 8 that the housing 2 may have slits 6 in a wall region adjoining the fastening flanges 16.

FIG. 3 shows a section taken along the plane III—III, but without the casting compounds being represented. The L-shaped struts 7, 13 are shown in FIG. 3 instead of the anchor-shaped struts 7, 14 shown in FIG. 2.

Figure 4:
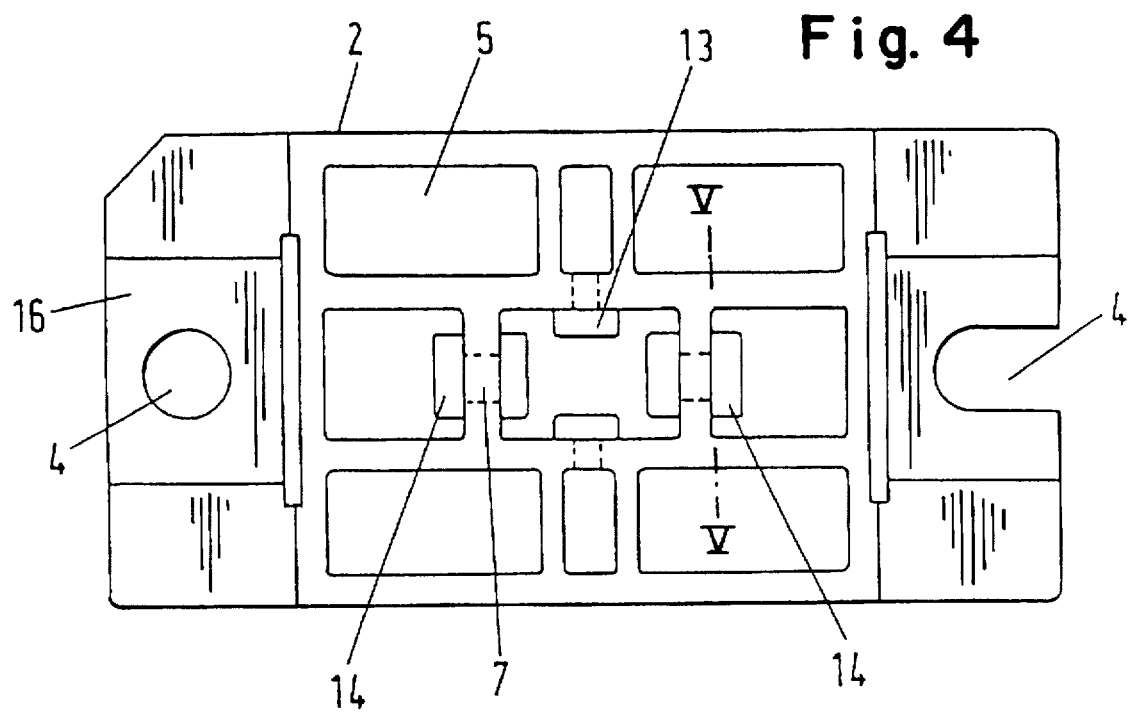
FIG. 4 is a plan view of a module housing.

FIG. 4 is a plan view of the housing 2 which again shows the various embodiments of struts 7 with transverse extensions 13, 14. A section plane V—V is furthermore indicated.

Figure 5:
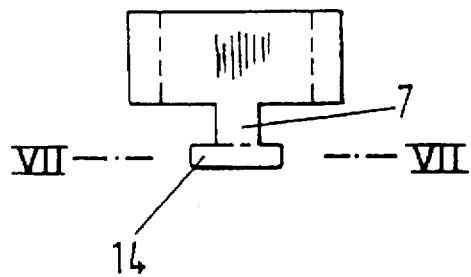
FIGS. 5 to 7 are sectional views of the module housing, with FIG. 5 being taken along the line V—V of FIG. 4 and FIG. 7 being taken along the line VII—VII of FIGS. 5 and 6.
Figure 7:
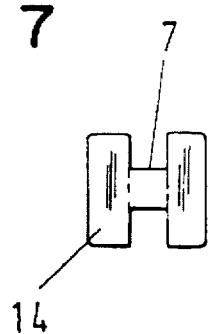
Figure 6:
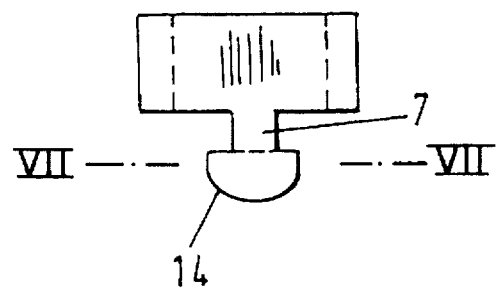

FIG. 5 shows a section through a strut which is taken along the plane V—V. In comparison to FIG. 5, FIG. 6 shows a variant of the strut configured with an anchor shape, with a lower surface of the transverse extension 14 being rounded, as a result of which an inclusion of air bubbles can be avoided during curing of the casting compound 10. FIG. 7 shows a section through a strut taken along the section plane VII—VII indicated in FIGS. 5 and 6.

FIG. 8 shows alternative embodiments of struts in a sectional representation and in a plan view. In this case, a transversely extending strut 7.1, which is located completely within the soft encapsulation 10, is represented as a first embodiment. The plan view shows that this strut 7.1 is also part of the plastic housing 2. A further possible construction of struts, i.e. struts 7.2 having a guide function, can be gathered from FIG. 8. These struts 7.2 are disposed in such a way that they can guide the terminals 3, especially during production of the module.

A power semiconductor module according to the invention can be produced as follows. As is disclosed by the publications mentioned at the start, a DCB (direct copper bond) substrate, for example with a size of 5×5 cm$^2$, is equipped with semiconductor components (chips) and terminals, and is adhesively bonded into the plastic housing. A soft encapsulation is then injected. Two-component resins, the strength of which can be adjusted by adjusting the mixing ratio, are suitable therefor. The product RTV 615 of General Electric can, for example, be used with a 1:1 ratio of its two components. A silicone gel such as the product Silgel 612 of the company Wacker is, for example, also suitable with a mixing ratio through which a high strength similar to the above-mentioned encapsulation is achieved. This soft encapsulation is a silicone rubber that cross-links even at room temperature, but the cross-linking process takes place faster at higher temperatures. The height of the encapsulation is selected in such a way that only a lower part, preferably having transverse extensions, of the struts penetrates into the encapsulation, whereas the remaining part of the internal housing struts remains projecting from the encapsulation.

In a further working step, epoxy resin is introduced as the hard encapsulation and is cured at approximately 130° C. At this temperature, the soft encapsulation (silicone encapsulation) expands and, after curing and cooling, leaves a gap with a thickness of approximately 1 mm remaining between it and the lower surface of the epoxy resin.

The construction of the struts disposed according to the invention, optionally with transverse extensions, depends on many requirements such as, for example, the substrate size, the position of external and internal terminals and injection-molding requirements.

The invention can also be used advantageously in the case of modules which have only a soft casting compound and in which a hard casting compound is completely dispensed with.

The power semiconductor module is intended for mounting on a heat sink, with thermal transfer paste being applied either onto the base of the module or onto the heat sink. In this case, the strut parts located in the rubber-type soft encapsulation oppose pressure forces on the substrate that may occur. The above-mentioned gap between the two casting compounds does not then have any effect, since the supporting takes place from the soft encapsulation.

We claim:

1. A power semiconductor module, comprising:

a plastic housing having a bottom plane;

a substrate disposed in said bottom plane of said housing;

structures including components and terminals and being disposed on said substrate in said housing;

a hard encapsulation disposed in said housing;

a soft encapsulation being disposed in said housing and being formed of a soft casting compound having a rubber-like consistency with a Shore hardness of $\geq 20$ after vulcanization; and internal struts in said housing supporting said soft encapsulation by extending into and at least partly embedded in said soft encapsulation and having no direct contact with said substrate nor with any said structures for opposing pressure forces that may occur on the substrate.

2. The power semiconductor module according to claim 1, wherein said substrate is a metal/ceramic multilayer substrate.

3. The power semiconductor module according to claim 1, wherein said substrate defines a plane, and said struts extend perpendicularly relative to said plane of said substrate and have an end facing said substrate with an L-shaped transverse extension on said end.

4. The power semiconductor module according to claim 1, wherein said substrate defines a plane, and said struts extend perpendicularly relative to said plane of said substrate and have an end facing said substrate with a T-shaped transverse extension on said end.

5. The power semiconductor module according to claim 1, wherein said substrate defines a plane, and said struts extend horizontally relative to said plane of said substrate and are disposed completely within said soft encapsulation.

6. The power semiconductor module according to claim 1, wherein said struts guide said terminals.

7. The power semiconductor module according to claim 1, wherein said housing has integrally molded fastening flanges, integrally molded housing walls, and wall regions between said fastening flanges and said housing walls having slits formed therein.

8. A power semiconductor module, comprising:

a plastic housing having a bottom plane;

a substrate disposed in said bottom plane of said housing;

structures including components and terminals and being disposed on said substrate in said housing;

a soft encapsulation being disposed in said housing and being formed of a soft casting compound having a rubber-like consistency with a Shore hardness of $\geq 20$ after vulcanization;

means rigidly supporting internal struts in said housing; and internal struts in said housing supported said soft encapsulation by extending into and at least partly embedded in said soft encapsulation and having no direct contact with said substrate nor with any said structures for opposing pressure forces that may occur on the substrate.

9. The power semiconductor module according to claim 8, wherein said substrate is a metal/ceramic multilayer substrate.

* * * * *